United States Patent
Wang et al.

(10) Patent No.: US 10,635,186 B1
(45) Date of Patent: Apr. 28, 2020

(54) DEVICES HAVING KEYBOARDS WITH FABRIC LAYERS

(71) Applicant: Apple Inc., Cupertino, CA (US)

(72) Inventors: Paul Xiaopeng Wang, Cupertino, CA (US); Markus Diebel, San Francisco, CA (US); Aidan N. Zimmerman, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/708,962

(22) Filed: Sep. 19, 2017

Related U.S. Application Data

(60) Provisional application No. 62/397,473, filed on Sep. 21, 2016.

(51) Int. Cl.
| | |
|---|---|
| G06F 3/02 | (2006.01) |
| G09G 5/00 | (2006.01) |
| G06F 3/033 | (2013.01) |
| G09G 5/08 | (2006.01) |
| H03K 17/96 | (2006.01) |

(52) U.S. Cl.
CPC ........ G06F 3/0202 (2013.01); H03K 17/9622 (2013.01)

(58) Field of Classification Search
CPC ........ H04L 41/12; H04L 49/70; H04L 63/083
See application file for complete search history.

(56) References Cited

U.S. PATENT DOCUMENTS

| | | | |
|---|---|---|---|
| 5,736,233 A * | 4/1998 | Fye | B32B 38/10 101/491 |
| 9,411,436 B2 | 8/2016 | Shaw et al. | |
| 2003/0058223 A1 | 3/2003 | Tracy et al. | |
| 2010/0101927 A1* | 4/2010 | Ichikawa | H01H 9/52 200/512 |
| 2011/0291938 A1 | 12/2011 | Wu et al. | |
| 2012/0327001 A1 | 12/2012 | Higginson | |
| 2013/0102217 A1* | 4/2013 | Jeon | D03D 15/0027 442/182 |
| 2013/0229356 A1* | 9/2013 | Marwah | H01H 13/704 345/170 |

(Continued)

FOREIGN PATENT DOCUMENTS

WO    WO-2016085791 A1 *  6/2016  .......... B24D 11/001

Primary Examiner — Nan-Ying Yang
(74) Attorney, Agent, or Firm — Treyz Law Group, P.C.; G. Victor Treyz; Kendall W. Abbasi

(57) ABSTRACT

Electrical equipment such as a tablet computer cover, a laptop computer, or other equipment may include a keyboard. The keyboard may have an array of key members. The key members may have key symbols that are illuminated with light from light-emitting diodes. Each key member may be supported by a corresponding key member support structure. A fabric layer such as a woven fabric layer having warp and weft strands formed from polymer or other materials may be sandwiched between each key member and corresponding key member support structure. Opaque masking material may be formed on peripheral portions of each key member support structure. Each key member may have a symbol formed from coating layers such as a white ink coating for light diffusing, a patterned black ink coating with a symbol-shaped opening, and a clear overcoat.

24 Claims, 12 Drawing Sheets

(56) References Cited

U.S. PATENT DOCUMENTS

| | | | | |
|---|---|---|---|---|
| 2014/0002366 A1* | 1/2014 | Gluckstad | ............ | G06F 1/1673 345/168 |
| 2014/0071654 A1* | 3/2014 | Chien | ................. | H01H 13/704 362/23.03 |
| 2015/0338883 A1 | 11/2015 | Farahani et al. | | |
| 2017/0304996 A1* | 10/2017 | Graham | ............... | B24D 11/001 |

* cited by examiner

DEVICES HAVING KEYBOARDS WITH FABRIC LAYERS

This application claims the benefit of U.S. provisional patent application No. 62/397,473, filed on Sep. 21, 2016, which is hereby incorporated by reference herein in its entirety.

FIELD

This relates generally to electronic equipment, and, more particularly, to electronic equipment with input devices such as keyboards.

BACKGROUND

Electronic equipment often contains keys. For example, laptop computers and detachable keyboards for tablet computers contain keys.

The incorporation of keys into electronic equipment can pose challenges. If care is not taken, may be uncomfortable to use or may be difficult to recognize.

SUMMARY

Electrical equipment such as a tablet computer cover, a laptop computer, or other equipment may include a keyboard. The keyboard may have an array of key members. The key members may have key symbols that are illuminated with light from light-emitting diodes.

Each key member may be supported by a corresponding key member support structure. A fabric layer such as a woven fabric layer having warp and weft strands formed from polymer or other materials may be sandwiched between each key member and corresponding key member support structure.

Opaque masking material may be formed on peripheral portions of each key member support structure. Each key member may have a symbol label formed from coating layers such as a white ink coating for light diffusing, a patterned black ink coating with a symbol-shaped opening, and a clear overcoat. Light from each light-emitting diode may pass through a corresponding key member support structure, fabric layer opening, symbol pattern, and key member.

DETAILED DESCRIPTION

Fabric, polymer sheets, printed circuits, molded plastic parts, and other structures may be used in forming items with keys such as keyboards. Keys may, for example, be incorporated into electronic equipment such as cellular telephones, tablet computers, wristwatch devices, laptop computers, media players, pendant devices, devices embedded in eyeglasses or other equipment worn on a user's head, or other electronic equipment, may be used in straps, cases, covers, or other accessories for electronic devices (e.g., a cover or other accessory that includes a keyboard), may be used in accessories such as headphones, may be used in seating having circuits or other furniture with circuitry for a home or office, may be used in forming a seat with circuitry, dashboard, or other item in a vehicle, may be used in forming part of embedded systems such as systems in which electronic equipment is mounted in kiosks, may be used in forming wearable items with circuitry such as necklaces, wrist bands, arm bands, shoes, or other items of clothing, may be used in forming other equipment with circuitry, or may be used in forming structures that implement the functionality of two or more of these items.

Keys in these items may be used for gathering alphanumeric input and for gathering commands to adjust device functions (e.g., keys may be used as volume buttons, menu buttons, power buttons, etc.). Illustrative configurations in which keys are arranged in an array for forming an alphanumeric keyboard may sometimes be described herein as an example. This is, however, illustrative. Keys may be used for gathering any suitable user input.

Figure 1:
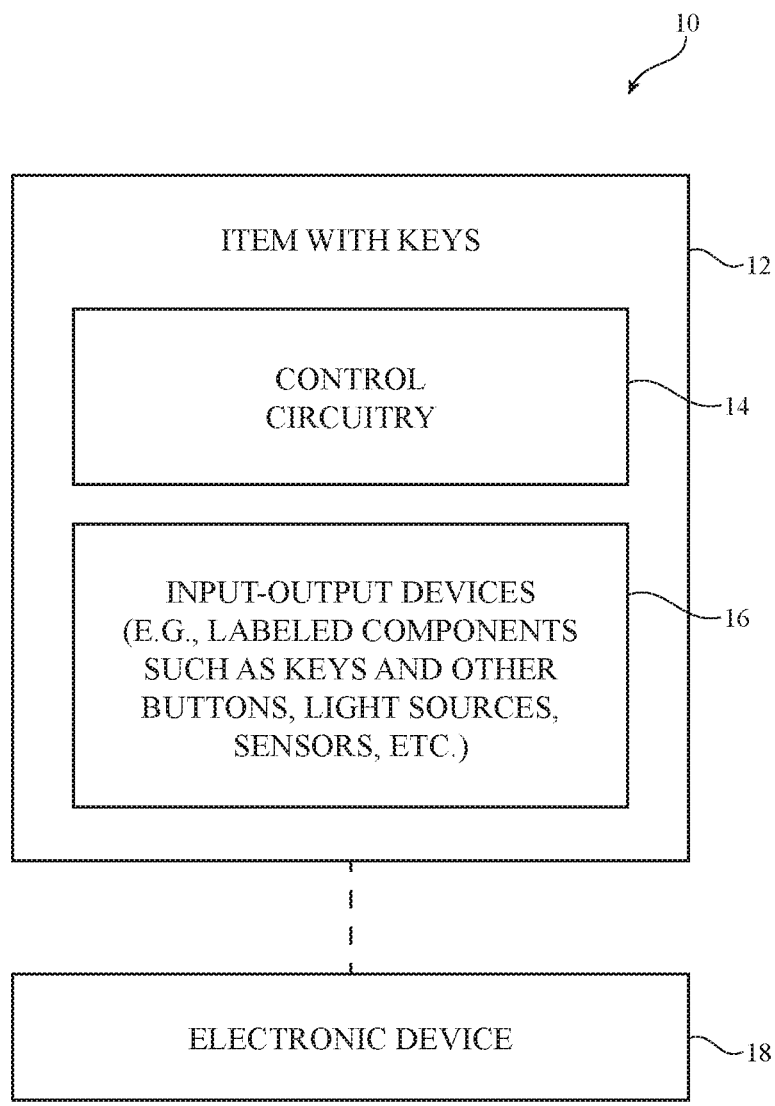
FIG. 1 is a schematic diagram of an illustrative item with keys in accordance with an embodiment.

Illustrative electronic equipment having keyboard keys or other keys is shown in FIG. 1. Equipment 10 may include an item with keys such as keyboard 12. Keyboard 12 may form part of an electronic device with a built-in keyboard such as a laptop computer or may be a stand-alone keyboard that can be coupled to optional additional electronic devices such as electronic device 18. For example, electrical equipment such as keyboard 12 may be part of removable case (sometimes referred to as a cover) for a tablet computer and electronic device 18 may be a tablet computer. Electronic device 18 and keyboard 12 may be mechanically coupled using magnets or other fasteners and can be electrically coupled using a wired and/or a wireless communications link. Other types of electrical equipment may include keyboard keys, if desired (e.g., cellular telephone, watches, media players, etc.). The configuration of FIG. 1 is merely illustrative.

Keyboard 12 may include fabric. The fabric may be used in forming a rear wall or other housing wall for a cover, for forming part of a wall of an electronic device, or for forming other structures. For example, a layer of fabric may cover the upper (front) surface of keyboard 12. This may help prevent moisture from entering keyboard 12 and may provide portions of keyboard 12 with an attractive fabric-like appearance.

Keyboard key members (e.g., plastic members formed from clear rigid polymer or key structures formed from other materials) may be attached to the outer surface of the fabric layer. The fabric of keyboard 12 may be soft (e.g., keyboard 12 may have a fabric surface that yields to a light touch), may have a rigid feel (e.g., a fabric surface in keyboard 12 may be formed from a stiff fabric), may be coarse, may be smooth, may have ribs or other patterned textures, and/or may be formed as part of a structure that has portions formed from non-fabric structures of plastic, metal, glass, crystalline materials, ceramics, or other materials.

Keyboard 12 of equipment 10 (and, if desired, device 18) may include control circuitry such as control circuitry 14. Control circuitry 14 may include storage and processing circuitry for supporting the operation of keyboard 12. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 14 may be used to gather keystroke information from an array of switches in keyboard 12 and may otherwise be used to control the operation of keyboard 12. The processing circuitry may be based on one or more microprocessors, microcontrollers, digital signal processors, baseband processors and other wireless communications circuits, power management units, audio chips, application specific integrated circuits, etc.

Input-output circuitry in keyboard 12 such as input-output devices 16 may be used to allow data to be supplied to keyboard 12 and to allow data to be provided from keyboard 12 to external devices. During operation, control circuitry 14 may use keys and other input-output devices 16 to gather input from a user, external equipment, and/or the environment around item 10. Control circuitry 16 may also use input-output devices 16 to provide output to a user or external equipment such as device 18.

Input-output devices 16 may include keyboard keys and other buttons, joysticks, scrolling wheels, touch pads, key pads, microphones, speakers, tone generators, vibrators, cameras, sensors such as touch sensors, capacitive proximity sensors, light-based proximity sensors, ambient light sensors, compasses, gyroscopes, accelerometers, moisture sensors, force sensors, data ports, displays, and other input-output devices.

Keys such as keyboard keys, status indicators, displays, trim structures, and other portions of keyboard 12 may be illuminated. For example, light-emitting diodes, lamps, electroluminescent panels, or other sources of light may be used in illuminating patterned openings. The patterned openings may pass through layers of fabric, may be formed on keyboard key members, and/or may be formed from other materials in keyboard 12.

The patterned openings may form symbols (e.g., letters and other alphanumeric characters, icons, etc.) or other illuminated shapes. The symbols or other patterned openings may form labels on keys or other input-output devices (sometimes referred to as glyphs or alphanumeric labels), may form labels on other illuminated structures, may form trim for a component (e.g., a halo surrounding a key), or may form other suitable illuminated areas. In some arrangements, transparent material (e.g., clear material, translucent material, and/or material that includes photoluminescent substances such as phosphors) may be formed in an opening and/or may overlap an opening. Light-transmitting windows in opaque structures may be formed from openings and optional transparent material overlapping the openings.

Arrangements in which keyboard keys in keyboard 12 have patterned openings or other transparent structures that form illuminated letters or other symbols that serve as labels for the keys may sometimes be described herein as an example. In general, however, input-output devices 18 may include one or more light sources that provide any suitable type of illumination for keyboard 12

Figure 2:
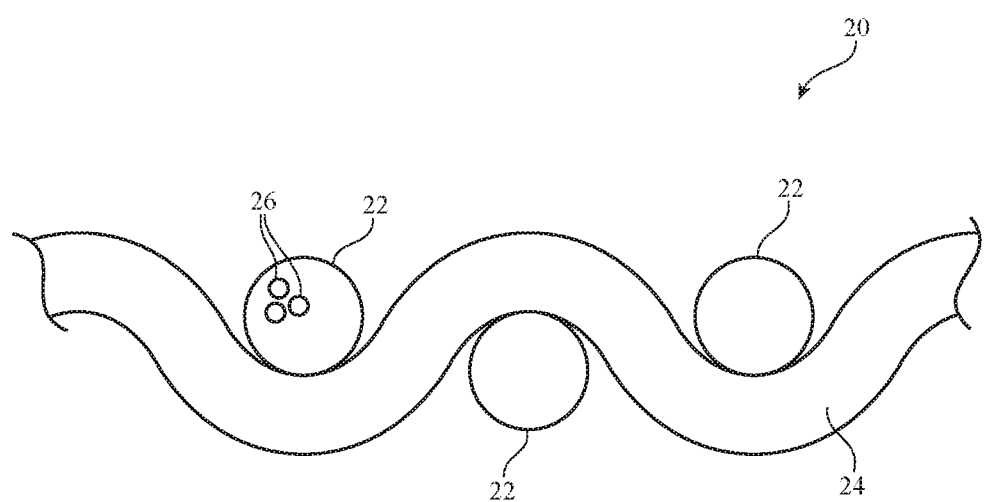
FIG. 2 is a cross-sectional side view of illustrative fabric in accordance with an embodiment.

Fabric for keyboard 12 may be formed from intertwined strands of material. A cross-sectional side view of an illustrative layer of fabric for keyboard 12 is shown in FIG. 2. As shown in FIG. 2, fabric 20 may include strands of material such as strands 22 and strands 24. With one suitable arrangement, fabric 20 may be a woven fabric (e.g., strands 22 may be warp strands and strands 24 may be weft strands). Other arrangements may be used for intertwining strands of material for forming fabric 20 for keyboard 12, if desired. In general, keyboard 12 may be woven, knitted, braided, may be intertwined to form felt, or may contain strands of material that have been intertwined using other intertwining techniques. In some arrangements, fabric 20 may include coatings (e.g., polymer coatings to prevent accumulation of dirt, materials that serve as moisture barrier layers, wear resistant coatings, transparent coatings such as patterned translucent coatings, etc.). These coating materials may penetrate into fabric 20 and/or may form layers on the inner and/or outer surfaces of fabric 20.

The strands of material that form the fabric may be monofilaments, may be multifilament strands (sometimes referred to herein as yarns or threads), may be formed from metal (e.g., metal monofilaments and/or yarns formed from multiple monofilament wires), may be formed from dielectric (e.g., polymer monofilaments and yarns formed from multiple polymer monofilaments), may include dielectric cores covered with conductive coatings such as metal (e.g., metal coated dielectric monofilaments and yarns of metal coated polymer-core monofilaments may be used to form conductive monofilaments and conductive yarns, respectively), may include outer insulating coatings (e.g., coatings of polymers or other dielectrics may surround each metal-clad polymer monofilament or each collection of metal-clad polymer monofilaments in a yarn, polymer insulation may enclose a multifilament metal wire, etc.), or may be other suitable strands of material for forming fabric.

As shown in the illustrative configuration of fabric 20 of FIG. 2, for example, strands such as strands 22 and 24 may be formed from strands of yarn that each contain multiple monofilaments 26. Configurations in which the fabric is formed from yarns (e.g., multifilament strands of material that are insulating or that contain metal wires and/or metal coatings on polymer monofilaments to render the yarns conductive) may sometimes be described herein as an example. This is, however, merely illustrative. Fabric 20 may be formed using monofilaments, multifilament strands of material (yarns), combinations of these arrangements, etc. The diameter of strands 22 and 24 that are formed from yarns containing multiple monofilaments may be, for example, 0.25 mm, may be 0.1 to 0.5 mm, may be more than 0.2 mm, may be less than 2 mm, or may be any other suitable diameter (width).

To allow light to pass through a layer formed from fabric and/or other materials in item 10, the layer of material in item 10 may be provided with transparent regions. The transparent regions may be formed from air-filled openings in opaque fabric and/or other opaque materials, may be formed from openings that are filled with transparent material (e.g., haze-free clear material or hazy translucent material, transparent fabric, or other transparent material), or may be formed from other structures that allow light to pass. In some configurations, an opaque fabric coating layer or other opaque layer (e.g., a layer of black ink or other opaque masking layer on a key member or other structure) may be provided with a patterned opening in addition to or instead of providing fabric 20 with patterned openings. Combinations of these approaches and/or other arrangements for providing illuminated structures in item 10 may be used, if desired.

Figure 3:
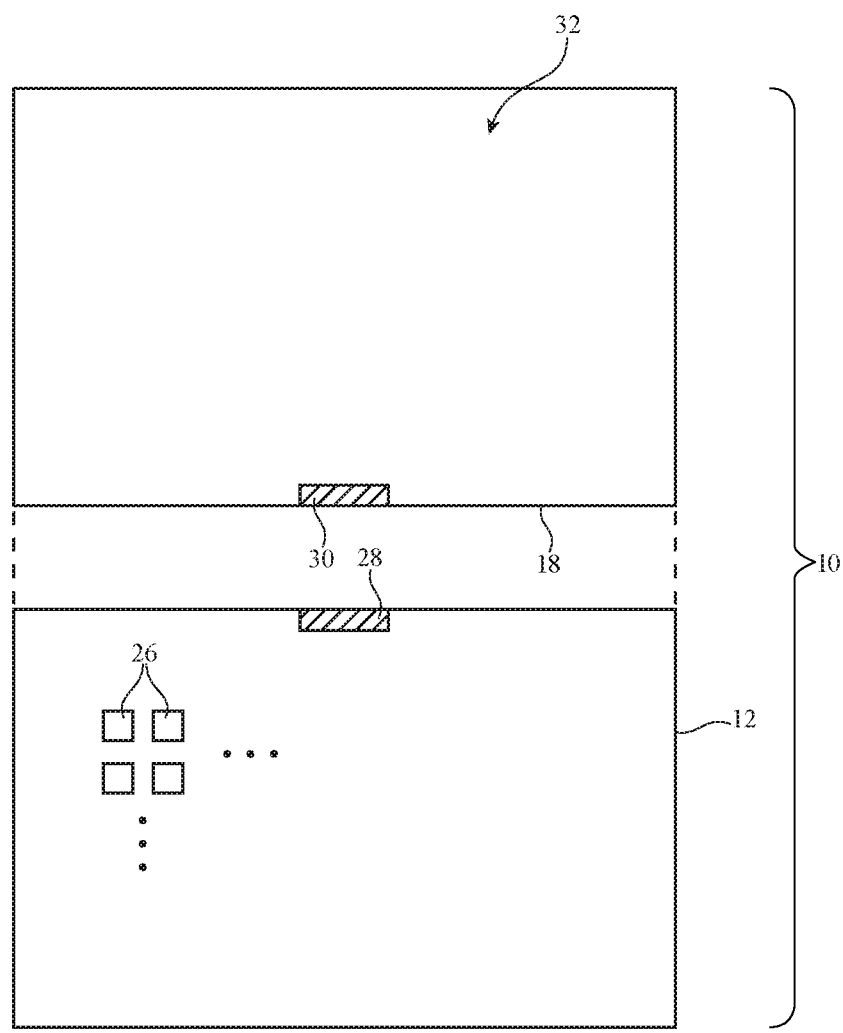
FIG. 3 is a diagram of illustrative electronic equipment including a keyboard having a fabric layer in accordance with an embodiment.

FIG. 3 is a diagram showing how keyboard 12 may be coupled to mating electrical equipment such as device 18. Device 18 may be, for example, a tablet computer having a touch screen display such as display 32. Display 32 may have a connector such as connector 30 that mates with a corresponding connector in keyboard 12 such as connector 28 or device 18 and keyboard 12 may communicate wirelessly. If desired, magnets or other fastening mechanisms may be provided in keyboard 12 and device 18 to hold keyboard 12 and device 18 together. Keyboard 12 may have a rectangular shape and may, if desired, have a folding flap (e.g., when keyboard 12 forms part of a cover for device 18).

Keyboard 12 may have an array of keyboard keys such as keys 26. Keys 26 may be arranged on keyboard 26 using a QWERTY layout or other suitable layout.

Figure 4:
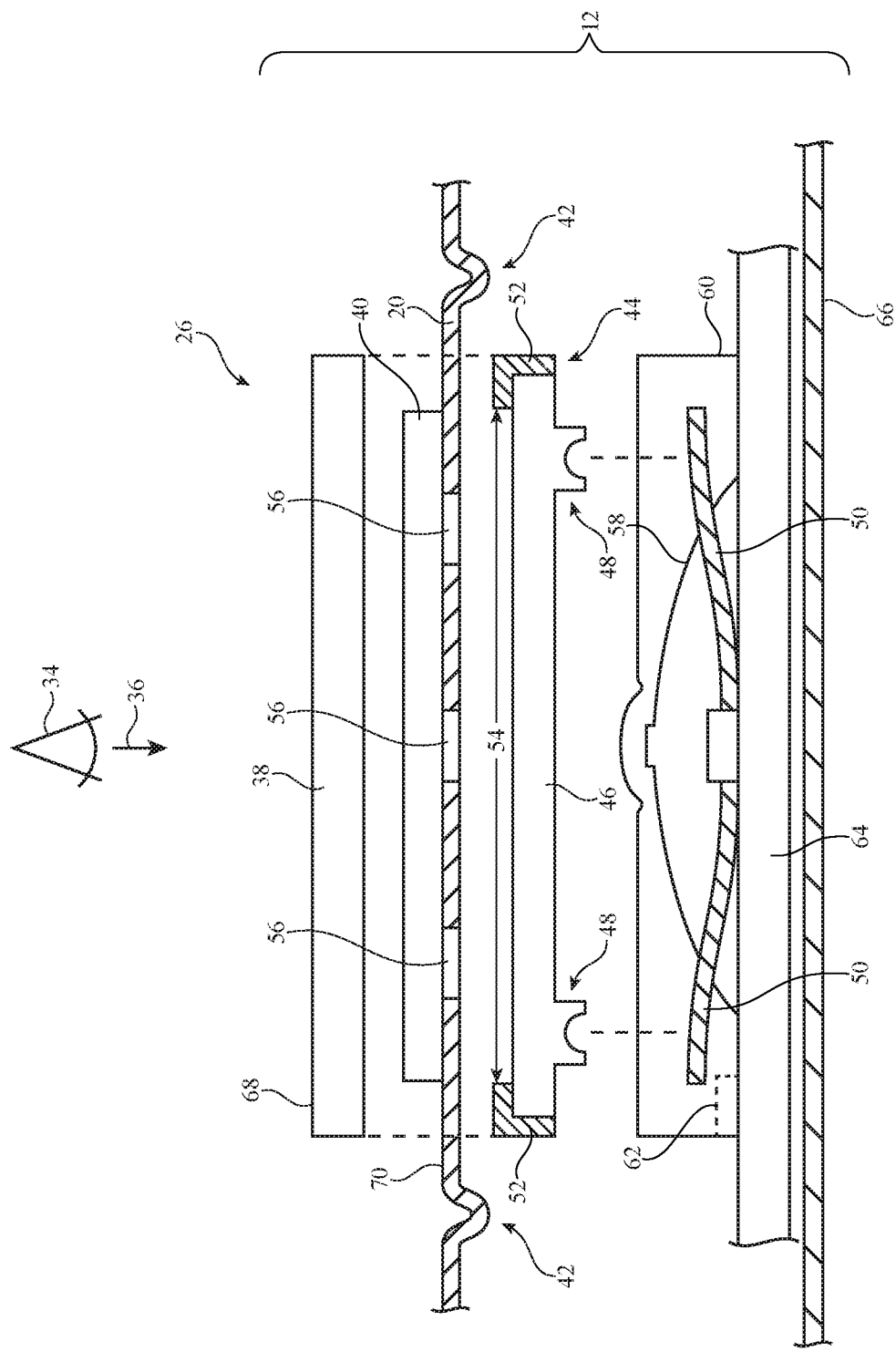
FIG. 4 is an exploded cross-sectional side view of a portion of an illustrative keyboard in accordance with an embodiment.

An exploded cross-sectional side view of a portion of an illustrative keyboard key in keyboard 12 is shown in FIG. 4. As shown in FIG. 4, a viewer such as viewer 34 may view the front (upper) exterior surface of keyboard 12 in direction 36. Keyboard key 26 may include a key member such as key member 38. When a user desires to supply input with key 26, the user may use a finger or other external object to press downward in direction 36 on upper surface 68 of key member 38. A switch such as dome switch 58 on printed circuit 64 may be compressed when key member 38 moves downwardly and may supply an upward restoring force when key member 38 is released. Dome switch 58 or other suitable switch in key 26 may be placed in either a closed state or open state. Dome switches 58 in keyboard 12 may be mounted to printed circuit 64. Control circuitry 14 may be coupled to printed circuit 64 and may monitor the state of switches 58 to determine whether keys 26 have been depressed.

Key member 68 may be attached to upper surface 70 of fabric layer 20 (e.g., using adhesive). One or more coating layers such as layer 40 may be formed on fabric layer 20, on key member 38 and/or on key support structures and other structures in key 26. These layers may include paint layers, photoluminescent layers, masking layers, clear protective overcoat layers, adhesive layers, and/or other layers of material.

Keyboard key member 38 may have a rectangular footprint (outline when viewed in direction 36) or may have other suitable shapes. To enhance the ability of fabric 20 to flex to accommodate vertical up and down movement of key member 38, flexibility enhancement structures may be incorporated into fabric 20. For example, one or more grooves or ridges such as illustrative peripheral groove 42 of FIG. 4 may run along the periphery of key member 38. These flexibility enhancement structures may provide surplus fabric to accommodate movement of key member 38 without distorting the planar upper surface of fabric 20. Grooves, ridges, and/or other flexibility enhancement structures for key 26 such as groove 42 may therefore prevent tightness in fabric 20 that might otherwise restrict vertical movement of key member 38 and may be formed by embossing fabric 20 using elevated temperature and/or pressure and/or by weaving groove 42 and/or other flexibility enhancement structures into fabric 20.

Key member 38, which may serve as a smooth and rigid capping structure at the top of key 26, may sometimes be referred to as a key cap. Key member support structure 46, which may be used to support key member 38 and help maintain upper surface 68 of key member 38 parallel to the plane of keyboard 12, may sometimes be referred to as a structural key cap.

As shown in FIG. 4, key member support structure 46 may have protrusions such as legs 48 that engage with corresponding arms of a key spring mechanism such as butterfly hinge mechanism 50 or other keyboard key mechanism for supporting key member 38 during operation of key 26. Butterfly mechanism 50 may be mounted on printed circuit board 64 (e.g., a flexible printed circuit formed from a sheet of polyimide or a flexible substrate formed from a layer of other flexible polymer or a rigid printed circuit board formed from a layer of fiberglass-filled epoxy or other rigid printed circuit board substrate material). Dome switch 58 may be mounted to printed circuit 64 in the center of hinge mechanism 50 and key housing structure 60 (sometimes referred to as a key base, key housing structures, key support structures, etc.). Structure 60 may have flexible portions (e.g., elastomeric portions) that allow dome switch 58 to flex and/or may have light guiding structures (e.g., clear polymer structures) that help distribute illumination for key 26.

Each key 26 in keyboard 12 may have an associated symbol. One or more light sources such as light-emitting diode 62 may be used to illuminate the symbol for each key 26. Light from light-emitting diode 62 may be distributed laterally using a clear light guide structure in key 26 (see, e.g., structure 60) and may then be scattered upwardly through key member support structure 46, layer 40, and key member 38. Light-emitting diode 62 may be a white light-emitting diode, a blue light-emitting diode that illuminates phosphorescent material in key 26, or other suitable light-emitting diode for providing keyboard 12 with key illumination. Light-emitting diodes 62 may be mounted on printed circuit 64.

Key member support structure 46 and key cap 38 may be formed from clear material (e.g., a rigid transparent polymer such as rigid polycarbonate, clear glass, transparent ceramic, or other suitable clear rigid material). A layer of opaque masking material such as black masking layer 52 may be formed on the upper surface and, if desired, edge surfaces of key member support structure 46 to block stray light from light-emitting diode 62. Opening 54 in opaque masking layer 52 may allow light from light-emitting diode 62 to pass through structure 46 and member 38.

Fabric 20 may have one or more openings such as openings 56 to allow light from light-emitting diode 62 to pass through fabric 20. If desired, other patterns of openings 56 may be formed in fabric 20 and other patterns of openings such as opening 54 may be formed in opaque masking layer 52 on support 46. The configuration of FIG. 4 is merely illustrative.

Keyboard 12 may have a rear housing wall formed from layer 66 (e.g., a woven fabric layer or other layer of fabric on the rear external surface of keyboard 12, a polymer layer, a layer of metal, etc.).

Figure 5:
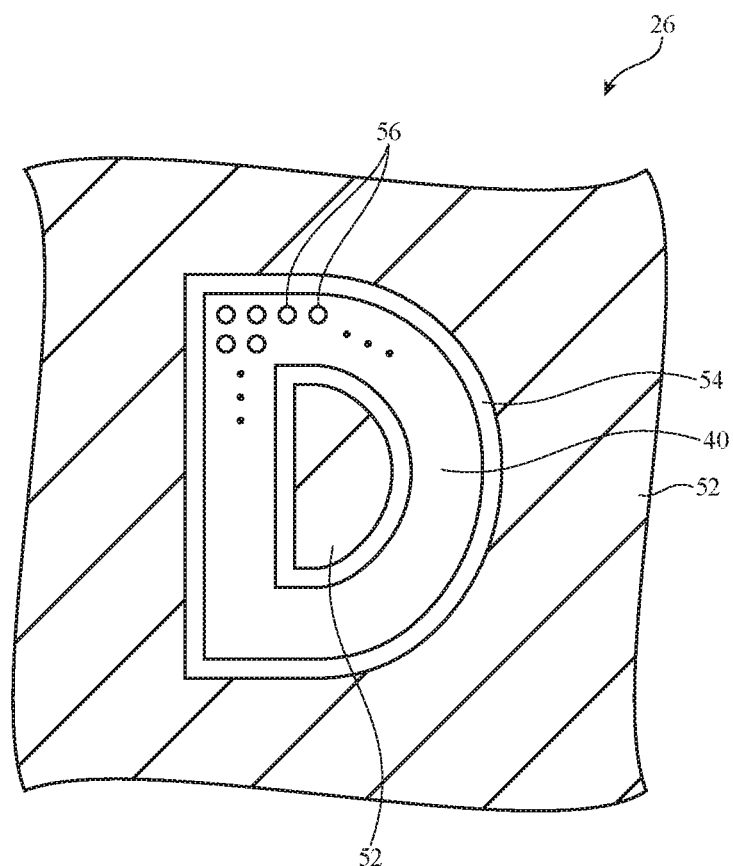
FIG. 5 is a top view of a portion of an illustrative keyboard key in accordance with an embodiment.

A top view of a portion of an illustrative key for keyboard 12 is shown in FIG. 5. In the example of FIG. 5, key 26 has been labeled with a "D" symbol. Fabric layer 20 has openings 56 that form paths through fabric layer 20 for light from light-emitting diode 62. Openings 56 may be formed by laser-drilling holes in fabric 20 or otherwise forming perforations in the shape of the symbol for key 26 (e.g., a "D" symbol in the example of FIG. 5). As shown in FIG. 5, opaque masking layer 52 may have a corresponding symbol-shaped opening (e.g., a "D-shaped" opening 54) that overlaps openings 56 and allows light from light-emitting diode 62 to pass through openings 56. One or more coating layers 40, which may be formed on key member 36, on fabric 20, and/or on key member support structure 46, may include a light-diffusing material such as a polymer layer that includes titanium dioxide particles or other light-diffusing particles. Coating material 40 may overlap openings 56 and may help diffuse light that is traveling through opening 54 in opaque masking layer 52 and through openings 56.

Figure 6:
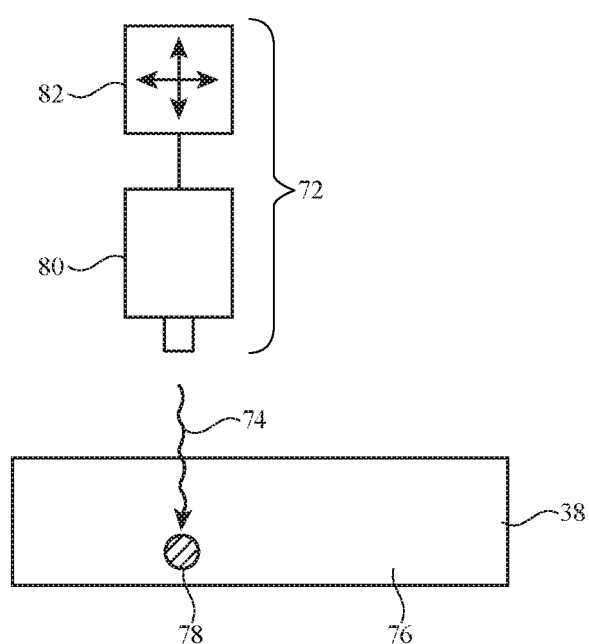
FIG. 6 is a side view of illustrative equipment for forming embedded light-scattering structures in the interior of a key member in accordance with an embodiment.
Figure 7:
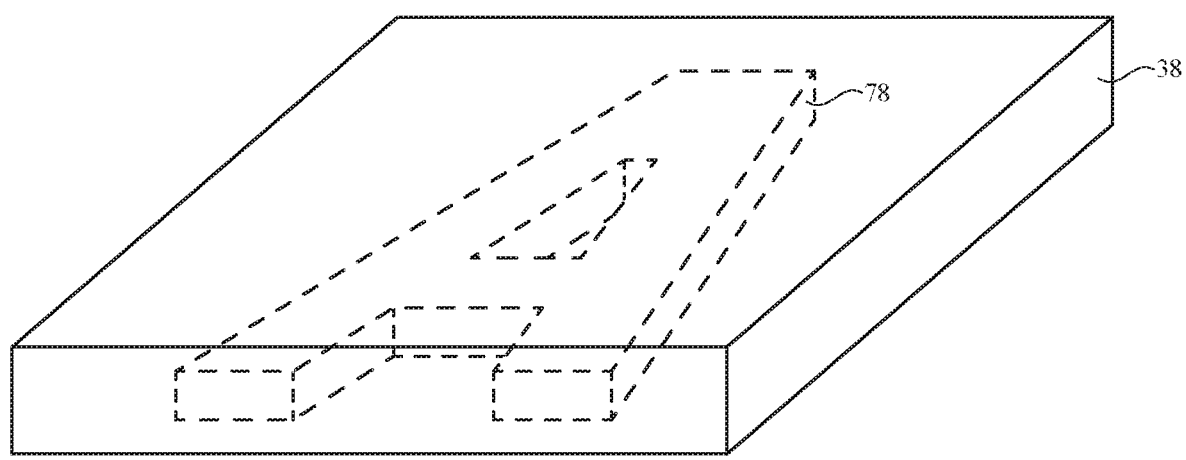
FIG. 7 is a perspective view of an illustrative key member with embedded light scattering structures in accordance with an embodiment.

If desired, light-scattering features may be incorporated into key member 38. In the illustrative configuration of FIG. 6, laser processing equipment 72 is being used to focus laser light 74 into interior 76 of key member 38. Laser processing equipment 72 may include laser 80 for generating laser light 74 (e.g., continuous wave laser light, pulsed laser light, laser light at visible, ultraviolet and/or infrared wavelengths, etc.) and may include a computer-controlled positioner such as positioner 82 for positioning laser 80 relative to member 38. Member 38 may be formed from a material such as glass, plastic, or other transparent material that can be damaged when exposed to high light intensities from laser 80. By using positioner 82 and laser 80 to create localized focused laser light in interior 76 of member 38, localized defects such as defect 78 may be formed in interior 76. Defects such as defect 78 may serve as light-scattering structures that scatter light produced by light-emitting diode 62. These light-scattering structures may be patterned to form light-diffusing symbols and other light-diffusing structures that are fully or partly embedded in the interior of key members 38. In the configuration of FIG. 7, for example, an "A" symbol has been formed from light-diffusing structures formed in the interior of key member 38 using localized laser processing.

Figure 8:
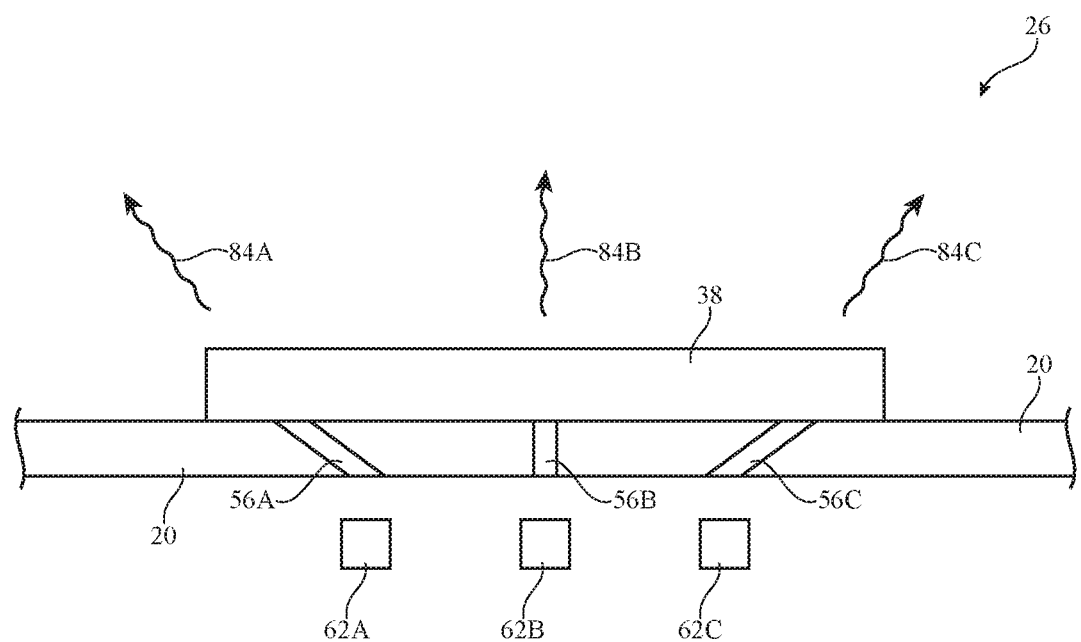
FIG. 8 is a cross-sectional side view of an illustrative key having adjustable backlight structures in accordance with an embodiment.

If desired, each key 26 in keyboard 12 may have multiple light-emitting diodes, as illustrated by light-emitting diodes 62A, 62B, and 62C in FIG. 8. Holes 56 may pass vertically through fabric 20 and/or may be angled. In the FIG. 8 example, hole 56A has been angled to the left and receives key illumination (backlight) 84A from light-emitting diode 62A, hole 56B has been oriented vertically and receives key illumination (backlight) 84B from diode 62B, and hole 56C has been angled to the right and receives key illumination (backlight) 84C from diode 62C. By varying the relative intensity of light 84A, 84B, and 84C, the direction of the backlight illumination and therefore the direction of the illumination for all or parts of the symbols that are illuminated in key 26 can be dynamically adjusted by control circuitry 14. Adjustments to key illumination may be made, for example, to change the aesthetic appearance of keys 26, to illuminate different parts of key symbols at different times, to illuminate different symbols for different users or for the same user when viewing keyboard 12 from different vantage points, etc. If desired, key member 38 of FIG. 8 may include embedded light-diffusing structures (e.g., key symbols, etc.), opaque masking material, light-diffusing ink, photoluminescent material, and/or other structures. These structures may be incorporated into keys 26 in addition to the adjustable-illumination-direction structures of FIG. 8.

FIGS. 9, 10, 11, and 12 show additional key illumination structures that may be incorporated into key member 38.

Figure 9:
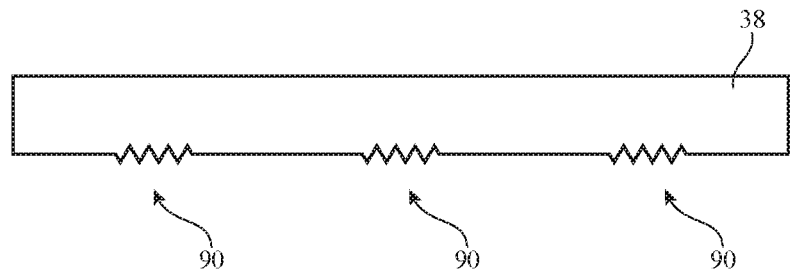
FIG. 9 is a cross-sectional side view of an illustrative key member having a lower surface with light-scattering structures in accordance with an embodiment.

In the example of FIG. 9, protrusions and recesses such as grooves, ridges, pits, and bumps have been created to form light-scattering surface features 90 on the lower surface of key member 38.

Figure 10:
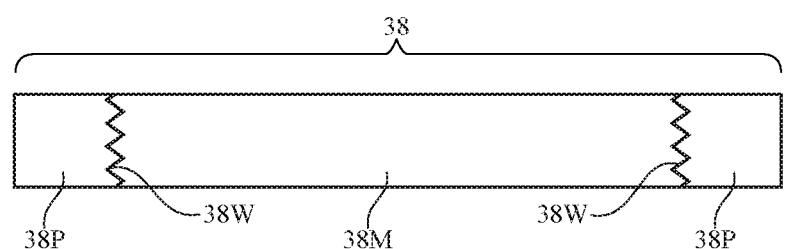
FIG. 10 is a cross-sectional side view of an illustrative key member having injection molding weld lines that serve as light-scattering structures in accordance with an embodiment.

In the example of FIG. 10, key member 38 has been formed by injection molding (e.g., a first injection molding process that forms central portion 38M and a second injection molding process that forms peripheral portion 38P). The injection molding process forms weld lines 38W, which may serve as light scattering structures in member 38.

Figure 11:
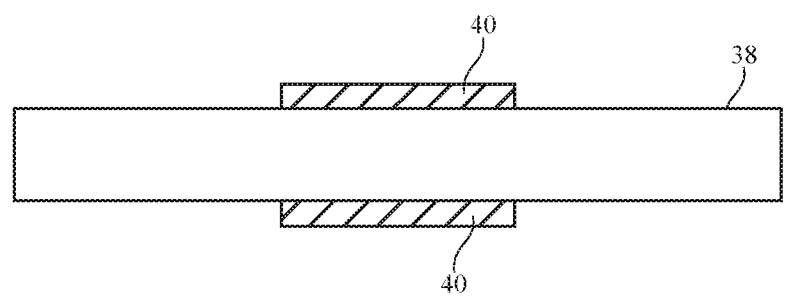
FIG. 11 is a cross-sectional side view of an illustrative key member having upper and/or lower coating layers in accordance with an embodiment.

FIG. 11 shows how coating layers 40 may be formed on the upper and/or lower surfaces of member 38. Coatings 40 may be formed from opaque masking material (e.g., black ink, etc.), may be formed from light-diffusing material (e.g., white ink, etc.), may be formed from protective clear coatings (e.g., encapsulant), may be formed from photoluminescent material (e.g., phosphors, etc.), and/or may be formed from colored ink or other materials.

Figure 12:
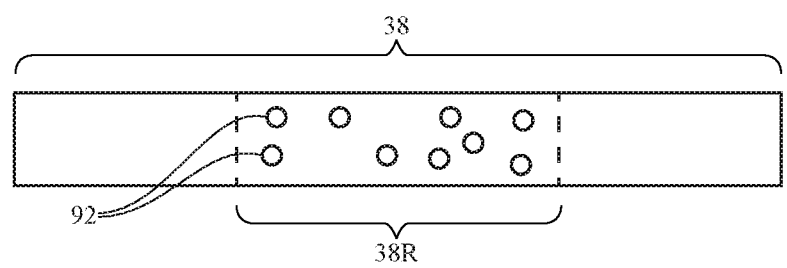
FIG. 12 is a cross-sectional side view of an illustrative key member that includes embedded phosphorescent material in accordance with an embodiment.

FIG. 12 shows how key member 38 may include regions such as portion 38R in which photoluminescent material 94 (e.g., phosphorescent material, etc.) has been incorporated into member 38.

The light-scattering structures and other structures of FIGS. 9, 10, 11, and 12 may be illuminated with light from one or more light-emitting diodes 62 and may, if desired, be used with patterned opaque masking layers on key member support structures 46, patterned openings in fabric 20, embedded light-diffusing structures in interior 76 of member 38, and/or other key structures to provide keys 26 with a desired appearance. The structures of FIGS. 9, 10, 11, and 12 may be patterned to form key symbols, key trim (e.g., key outline patterns), and/or other suitable illumination patterns for keys 26.

Figure 13:
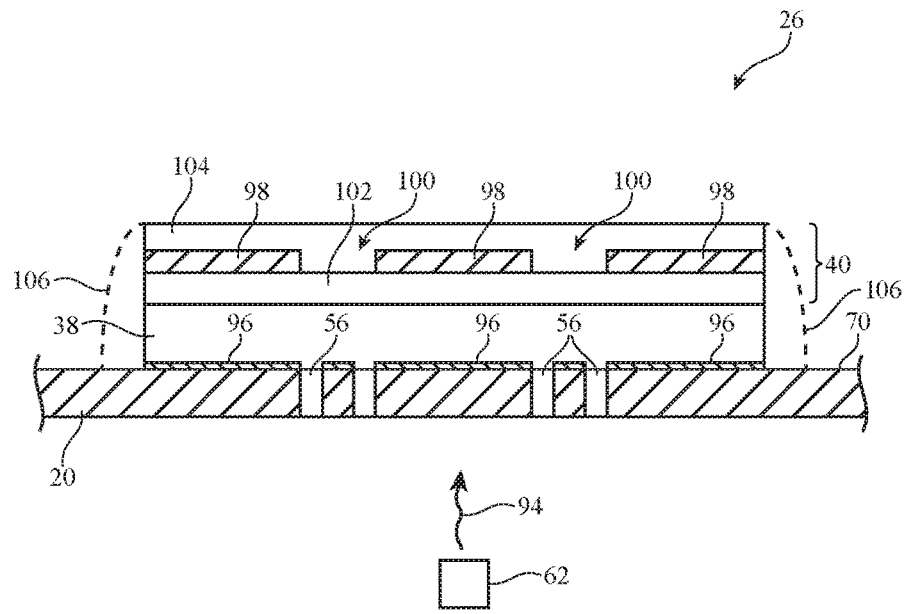
FIG. 13 is a cross-sectional side view of an illustrative key with a printed glyph in accordance with an embodiment.

FIG. 13 is a cross-sectional side view of an illustrative key 26 in which key illumination 94 is being produced by light-emitting diode 62. Fabric 20 has a pattern of openings 56 that may form a key symbol (as an example). Key member 38 may be attached to upper surface 70 of fabric 20 using adhesive 96. Coatings 40 on key member 38 may be patterned to form a key symbol or other pattern. Coatings 40 may include a light-diffusing layer such as white ink layer 102. Opaque masking layer 98 (e.g., a patterned layer of black ink, etc.) may be formed on layer 102 and may be patterned to form openings 100 in the shape of a symbol (e.g., a key symbol for key 26) or other pattern. Overcoat layer 104 may be a clear protective polymer layer. If desired, some or all of the layers of coating 40 may extend down some or all of the sidewalls of member 38, as shown by illustrative sidewall coating layers 106.

Figure 14:
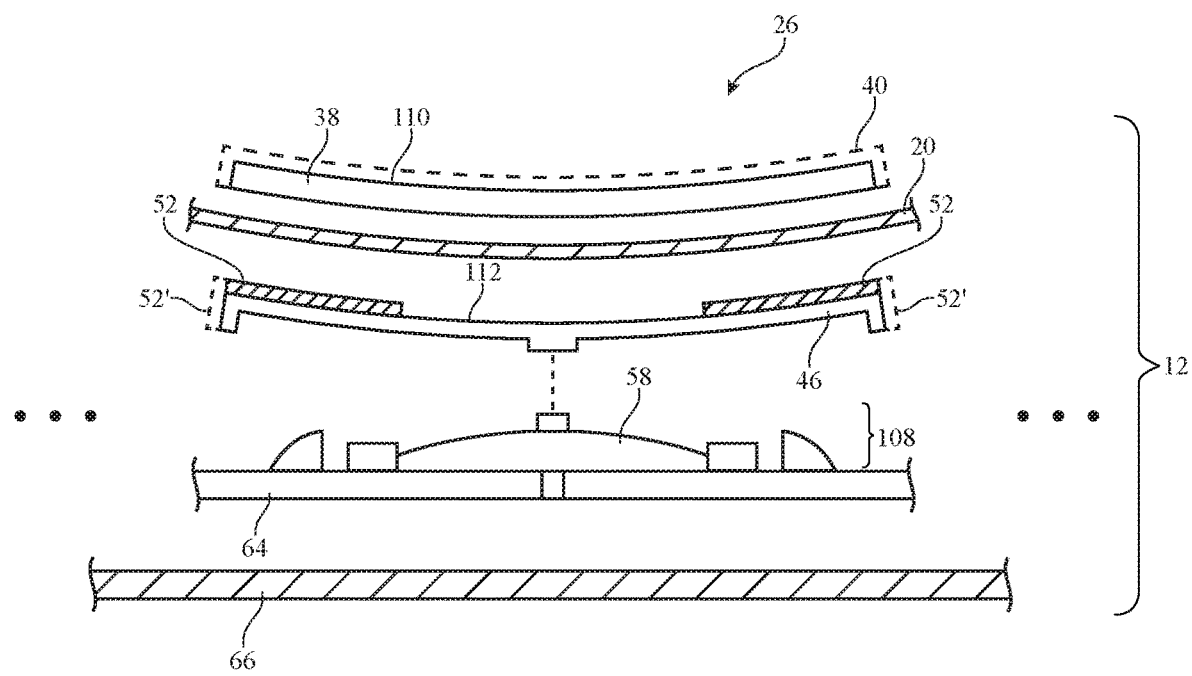
FIG. 14 is an exploded cross-sectional side view of a portion of an illustrative keyboard having concave key members in accordance with an embodiment.

FIG. 14 shows how member 38 may have a concave upper surface 110. Concave surfaces such as surface 110 of key 26 of FIG. 14 may help a user locate the center of keys 26 in keyboard 12. Dome switches 58 and other key structures 108 (hinges, support members, light guides, etc.) may be located under each key member 38. Key member 38 may have an associated key member support structure such as key member support structure 46. Upper surface 112 of support structure (support member) 46 may have a concave surface or other surface that matches the surface curvature of the lower surface of key member 38. Fabric 20 may be sandwiched between member 38 and support structure 46. A layer of adhesive may be formed on both sides of fabric 20 so that structures 46 and member 38 adhere to fabric 20.

Optional opaque masking material 52 may be formed around the periphery of support structure 46 and may extend partly or fully down the sidewalls of support structure 46, as shown by optional sidewall material 52'. Coatings 40 (e.g., one or more of coatings 40 of FIG. 13 and/or other coating layers) may be formed on upper surface 110 and, if desired, sidewall surfaces of member 38. Coatings 40 may, for example, be patterned to form a desired key symbol for key 26.

Figure 15:
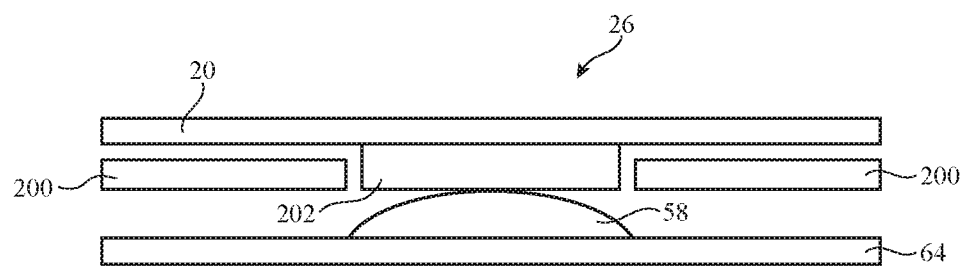
FIGS. 15, 16, 17, 18, and 19 show illustrative configurations for incorporating fabric into a keyboard in accordance with embodiments.

FIG. 15 shows how key 26 may have a key structure 202 (e.g., a structure including members such as key member 38, key member support structure 46, and/or other structures) that is mounted to fabric 20 (e.g., using adhesive, etc.). Key structure 202 may be mounted below fabric 20, above fabric 20, and/or may have portions above and below fabric 20 (e.g., key member 38 and key member support structure 46, respectively). Key support structures such as key web 200 may be used to provide support to keys such as key 26 and/or the keyboard in which the keys are mounted. In the example of FIG. 15, fabric 20 is attached to keys 26 (e.g., fabric 20 is mounted only to the surface of key structure 202 in each key 26) and is not mounted to key web 200.

Figure 16:
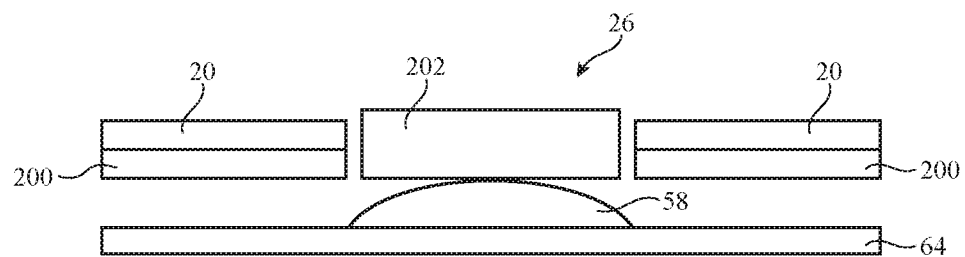

In the illustrative configuration of FIG. 16, fabric 20 is mounted to the surface of key web 200 only and is not mounted to keys 26 (e.g., fabric 20 is not attached to the surfaces of key structures 202).

Figure 17:
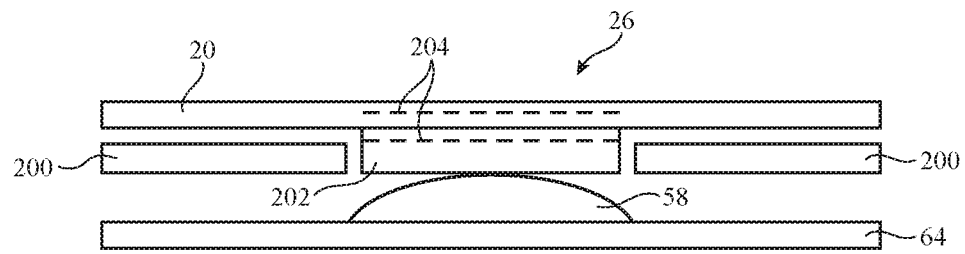

As shown in FIG. 17, fabric 20 may have portions that are attached to both key web 200 and key structures 202. Key structures 202 of FIG. 17 may have structures mounted above fabric 20, structures mounted below fabric 20, and/or structures that are mounted both above and below fabric 20.

Keys 26 may, if desired, include sensors such as force sensors, touch sensors, optical sensors, capacitive sensors, and/or other sensors for detecting input from a user's finger, a stylus, and/or other external objects and/or for gathering gesture input. These sensors may overlap keys 26 and, if desired, portions of key web 200 or other key support structures. As shown in FIG. 17, as an example, sensors 204 may be formed in portions of fabric 20 that overlap keys 26 (and, if desired that overlap key web 200) and/or may be formed in key structure 202. Sensors 204 of FIG. 17 may be force sensors, touch sensors, and/or other sensors and may be based on optical sensor components, capacitive sensor components, and/or other sensor components. As an example, sensors 204 may include an array of capacitive sensor electrodes for gathering touch input (and, if desired, proximity sensor input and/or gesture input), may include an array of conductive strands of material in fabric 20 that form capacitive sensor electrodes for gathering touch input, force input, and/or other input, and/or may be other types of sensor components.

Figure 18:
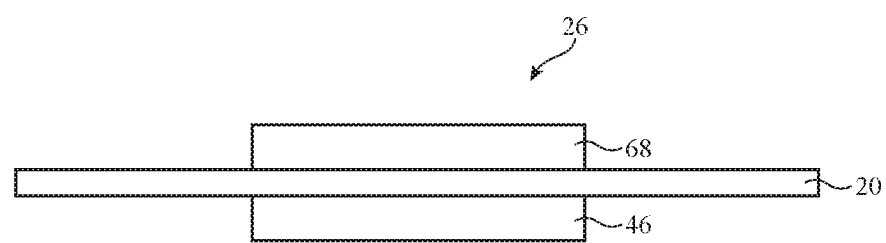
Figure 19:
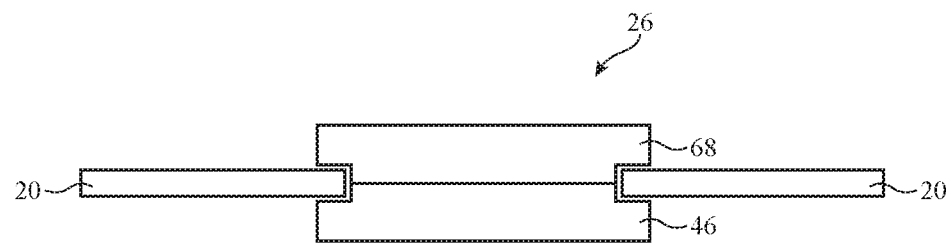

FIGS. 18 and 19 show how key structures in keys 26 may be coupled to fabric 20. In the example of FIG. 18, fabric 20 is sandwiched between key member 38 and key member support structure 46. In this type of arrangement, fabric 20 may form a complete or nearly complete sheet of intertwined strands of material. Touch sensors can be formed from conductive strands of material in fabric 20 that serve as capacitive touch sensor electrodes (as an example).

In the example of FIG. 19, fabric 20 has key openings (void holes) under most or all of each key 26. Key 26 may, for example, be formed from structures such as key member 38 and/or key member support structure 46 that pass through a key-shaped opening in fabric 20. This type of configuration may be helpful in allowing key symbol illumination to pass to a viewer and allows member 38 to be rigidly joined to key member support structure 46 using adhesive.

Fabric 20 in configurations of the type shown in FIGS. 18 and 19 may or may not be attached to key web 200 (FIGS. 15, 16, and 17).

The foregoing is merely illustrative and various modifications can be made to the described embodiments. The foregoing embodiments may be implemented individually or in any combination.

What is claimed is:

1. Electrical equipment, comprising:
   an array of keys each of which includes a switch and a key member;
   a layer of fabric having a first surface facing the key members and having an opposing second surface facing the switches; and
   light-emitting diodes that emit light, wherein the layer of fabric has an array of fabric openings for each key through which the light passes, wherein the key member overlaps the array of fabric openings, and wherein the array of fabric openings under each key member is patterned to form an alphanumeric key symbol.

2. The electrical equipment defined in claim 1 wherein the keys each include a key member support structure and wherein a portion of the layer of fabric is sandwiched between the key member support structure and the key member of each key.

3. The electrical equipment defined in claim 2 wherein the fabric comprises woven fabric.

4. The electrical equipment defined in claim 2 wherein the key members are formed from transparent polymer and wherein the key members further comprise light-scattering structures embedded in interior portions of the transparent polymer.

5. The electrical equipment defined in claim 4 wherein the light-scattering structures are configured to form symbol-shaped light-diffusing structures in the keys.

6. The electrical equipment defined in claim 5 wherein the light that is emitted by the light-emitting diodes is scattered by the light-diffusing structures in the keys.

7. The electrical equipment defined in claim 1 further comprising opaque masking material on the key member support structures, wherein the opaque masking material has at least one opening through which the light passes.

8. The electrical equipment defined in claim 1 wherein each key member has a light-scattering structure selected from the group consisting of: a light-scattering surface with protrusions and recesses on the key member, an injection-molding weld line in the key member, and phosphorescent material in the key member.

9. The electrical equipment defined in claim 1 wherein each key has coatings on the key member of that key and wherein the coatings comprise a white ink layer on the key member, an opaque masking layer on the white ink layer that has a symbol-shaped opening, and a clear overcoat layer that covers the opaque masking layer.

10. The electrical equipment defined in claim 1 further comprising a support structure with openings, wherein each of the openings receives a respective one of the keys.

11. The electrical equipment defined in claim 10, wherein the fabric is attached to the key members and not the support structure.

12. The electrical equipment defined in claim 10 wherein the fabric is attached to the key members and the support structure.

13. A keyboard, comprising:
a woven fabric layer having warp strands and weft strands;
an array of clear key members attached to a first surface of the woven fabric layer, wherein each clear key member has opposing upper and lower transparent surfaces;
an array of clear key member support structures on an opposing second surface of the woven fabric layer, each key member support structure supporting a respective one of the clear key members to form a corresponding keyboard key, wherein the woven fabric has at least one opening between each clear key member and each clear key member support structure;
an array of light-emitting diodes, each light-emitting diode being configured to emit light through the at least one opening of a respective one of the keys; and
a symbol-shaped light-diffusing pattern embedded in each of the clear key members, wherein the symbol-shaped light-diffusing pattern is interposed between the upper and lower transparent surfaces of each clear key member.

14. The keyboard defined in claim 13 further comprising:
a fabric wall that forms an external keyboard surface; and
a printed circuit on which the light-emitting diodes are mounted, wherein the printed circuit is interposed between the fabric wall and the array of light-emitting diodes.

15. The keyboard defined in claim 14 further comprising an array of switches, each switch forming part of a respective key and being located between a respective key member support structure and the printed circuit.

16. The keyboard defined in claim 14 further comprising black ink on each of the key member support structures, wherein the black ink on each of the key member support structures has an opening through which the light from a respective one of the light-emitting diodes passes.

17. The keyboard defined in claim 16 further comprising:
a light-diffusing coating on each key member; and
a layer of opaque masking material with a symbol-shaped opening on each light-diffusing coating.

18. An apparatus, comprising:
a printed circuit;
at least one dome switch on the printed circuit;
a fabric layer that overlaps the dome switch;
a key member on the fabric layer, wherein the fabric layer is interposed between the key member and the switch and wherein the fabric layer has an array of fabric perforations that are covered by the key member and that have an alphanumeric symbol shape; and
a key symbol on the key member.

19. The apparatus defined in claim 18 further comprising:
a key member support structure between the switch and the fabric layer, wherein the fabric layer is sandwiched between the key member support structure and the key member.

20. The apparatus defined in claim 19 wherein the key member comprises a clear polymer member with at least one concave surface, wherein the key member support structure comprises clear polymer, and wherein the apparatus further comprises a light-emitting diode that is configured to emit light that passes through the key member support structure, the array of fabric perforations in the fabric layer, the key member, and the key symbol on the key member.

21. Electrical equipment, comprising:
a fabric layer that forms an exterior surface of the electrical equipment and that includes an array of fabric layer openings;
an array of keys, wherein each key is received within and aligned with a respective one of the fabric layer openings; and
a support structure having support structure openings each of which is aligned with a respective one of the fabric layer openings, wherein the fabric layer is attached to the support structure and not the keys.

22. The electrical equipment defined in claim 21 wherein each key has a key member and has a key member support structure attached to the key member through a respective one of the fabric layer openings and a respective one of the support structure openings.

23. The electrical equipment defined in claim 22 further comprising:
an array of light-emitting diodes, wherein each light-emitting diode is configured to emit light through a respective one of the keys.

24. The electrical equipment defined in claim 21 wherein the fabric layer openings each have a first lateral dimension and the array of keys each have a second lateral dimension that is smaller than the first lateral dimension.

\* \* \* \* \*